United States Patent
Iqbal

(10) Patent No.: US 12,463,657 B2
(45) Date of Patent: Nov. 4, 2025

(54) SYSTEM AND METHOD FOR LIGHTWEIGHT IN-FIELD COMPRESSION OF SEISMIC DATA

(71) Applicant: KING FAHD UNIVERSITY OF PETROLEUM AND MINERALS, Dhahran (SA)

(72) Inventor: Naveed Iqbal, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 231 days.

(21) Appl. No.: 18/355,832

(22) Filed: Jul. 20, 2023

(65) Prior Publication Data

US 2025/0030435 A1   Jan. 23, 2025

(51) Int. Cl.
*H03M 1/00* (2006.01)
*H03M 3/02* (2006.01)
*H03M 7/30* (2006.01)
*H03M 7/34* (2006.01)

(52) U.S. Cl.
CPC ......... *H03M 3/022* (2013.01); *H03M 7/3051* (2013.01); *H03M 7/6011* (2013.01); *H03M 7/70* (2013.01)

(58) Field of Classification Search
CPC .. H03M 3/022; H03M 7/3051; H03M 7/6011; H03M 7/70; H03M 7/3059
See application file for complete search history.

(56) References Cited

U.S. PATENT DOCUMENTS

| | | | | |
|---|---|---|---|---|
| 4,509,150 A * | 4/1985 | Davis | ................... | H04B 14/068 702/14 |
| 10,094,941 B2 * | 10/2018 | Mousa | .................... | G01V 1/003 |
| 2011/0069741 A1 * | 3/2011 | Erickson | .................. | G01V 1/28 375/147 |
| 2016/0327661 A1 * | 11/2016 | Mousa | ...................... | G01V 1/28 |
| 2020/0326348 A1 * | 10/2020 | Qiao | ....................... | G16B 30/20 |
| 2021/0103066 A1 | 4/2021 | Khan et al. | | |

OTHER PUBLICATIONS

Hilal H. Nuha, et al., "Seismic Data Compression Using Deep Neural Network Predictors", SEG International Exposition and 89th Annual Meeting, SEG Technical Program Expanded Abstracts, Paper No. 10.1190/SEGAM-2019-3205392.1, Aug. 2019, pp. 258-262.

Hilal H. Nuha, et al., "Deep Neural Networks with Extreme Learning Machine for Seismic Data Compression", Arabian Journal for Science and Engineering, vol. 45, May 23, 2019, pp. 1367-1377.

* cited by examiner

*Primary Examiner* — Jean B Jeanglaude
(74) *Attorney, Agent, or Firm* — Oblon, McClelland, Maier & Neustadt, L.L.P.

(57) ABSTRACT

A system, method, and non-transitory computer readable medium for in-field seismic data compression. The system includes geophones each having a 1-bit adaptive delta modulation for converting analog seismic signals to a modulated signal and transmitting the modulated signal, and a data collection center having a 1D convolutional neural network for receiving and compressing the transmitted modulated signal. The 1D CNN is configured to suppress quantization and random noise in the modulated signal.

20 Claims, 12 Drawing Sheets

SYSTEM AND METHOD FOR LIGHTWEIGHT IN-FIELD COMPRESSION OF SEISMIC DATA

STATEMENT REGARDING PRIOR DISCLOSURE BY THE INVENTORS

Aspects of this technology are described in an article "1-ADM-CNN: A Lightweight In-field Compression Method for Seismic Data," Iqbal, Naveed. In: IEEE Transactions on Circuits and Systems II: Express Briefs, 2022, p. 1. The article was published Jul. 25, 2022, and is herein incorporated by reference in its entirety.

BACKGROUND

Technical Field

The present disclosure is directed to a method and system including a 1D convolutional neural network (CNN) together with 1-bit adaptive delta modulation for in-field seismic data compression.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

With advancements in the use of acoustic sensors, the use of seismic data acquisition is increasing exponentially. In order to develop high-quality seismic maps of subsurface formations based on the acquired data, an effective method for handling large quantities of data is essential. High-quality depth images require accurate acquisition and improved statistical sampling to understand the subsurface characteristics of a region. Seismic maps are useful to both geologists and geophysicists for needs such as deriving a target depth estimate for a proposed well location.

Distributed acoustic sensing (DAS) is an emerging technology for seismic monitoring, for example, for oil and gas. The significant amount of data produced by DAS poses challenges that necessitate the development of new technologies for efficient data handling and processing. A typical seismic survey can generate hundreds of terabytes of raw seismic data per day which places an enormous demand on wireless seismic data transmission. The massive amount of data transmission from geophones to an on-site data collection center and its storage poses significant challenges.

The massive amount of seismic data requires extensive storage at the data center. A solution is to compress seismic data. Various techniques have been proposed over the decades for compressing seismic data to achieve higher compression ratios at a higher signal-to-noise ratio (SNR). Among transformation techniques, discrete cosine transform performs well, particularly when the original input data rate was reduced by one-third. See A. Spanias, S. Jonsson, and S. Stearns, "Transform methods for seismic data compression," IEEE Trans. Geosci. Remote Sens., vol. 29, no. 3, pp. 407-416, May 1991, incorporated herein by reference in its entirety. Another class of transformation methods is based on wavelet transform approaches See J. Villasenor, R. Ergas, and P. Donoho, "Seismic data compression using high-dimensional wavelet transforms," in Proc. Data Compression Conf.—(DCC). IEEE Comput. Soc. Press, 1996, pp. 396-405; C. Fajardo, O. M. Reyes, and A. Ramirez, "Seismic data compression using 2d lifting-wavelet algorithms," Ing. y Cienc., vol. 11, no. 21, pp. 221-238, February 2015; A. Vassiliou and V. Wickerhauser, "Comparison of wavelet image coding schemes for seismic data compression," in SEG Tech. Progr. Expand. Abstr. Society of Exploration Geophysicists, January 1997, pp. 1334-1337. Their effective data representation and direct data reconstruction make them popular among researchers. The commonly used cosine and wavelet-based methods, however, are non-adaptive and incapable of dealing with the high oscillation nature of seismic waves. See A. Averbuch, F. Meyer, J.-O. Stromberg, R. Coifman, and A. Vassiliou, "Low bit-rate efficient compression for seismic data," IEEE Trans. Image Process., vol. 10, no. 12, pp. 1801-1814 December 2001. To address these issues, the authors in L. C. Duval et al. propose an improvement of the wavelet transform method using filter banks. See L. C. C. Duval and T. Q. Nguyen, "Seismic data compression: A comparative study between genlot and wavelet compression," in SPIE, 1999, pp. 802-81. Furthermore, to handle the oscillatory behavior of seismic waves, a hybrid compression technique which is a combination of the wavelet-based method and the local cosine method is proposed by Averbuch et al. See A. Z. Averbuch, A. A. Zheludev, M. Guttmann, and D. D. Kosloff, "Lct-wavelet based algorithms for data compression," Int. J. Wavelets, Multiresolution Inf. Process., vol. 11, no. 05, p. 1350032, September 2013.

As the oil and gas industry uses more wireless seismic data collection available wireless channel bandwidth presents a barrier to the scale and density of the sensors to be installed, thereby reducing the Earth's subsurface sampling density. See N. Iqbal, S. Al-Dharrab, A. Muqaibel, W. Mesbah, and G. Stuber, "Analysis of wireless seismic data acquisition networks using markov chain models," in IEEE 29th Annu. Int. Symp. Pers. Indoor Mob. Radio Commun., 2018, pp. 1-5; N. Iqbal, A. Zerguine, and S. Khan, "OFDMA-TDMA-based seismic data transmission over tv white space," IEEE Commun. Lett., vol. 25, no. 5, pp. 1720-1724 May 2021. To overcome this challenge, previous studies have advocated for putting some intelligence, i.e., computing power, to compress the data at the geophones in the field. See A. Bilgin, M. Marcellin, and M. Altbach, "Compression of electro-cardiogram signals using jpeg2000," IEEE Trans. Consum. Electron., vol. 49, no. 4, pp. 833-840, November 2003; X. Zhang, S. Zhang, J. Lin, F. Sun, X. Zhu, Y. Yang, X. Tong, and H. Yang, "An efficient seismic data acquisition based on compressed sensing architecture with generative adversarial networks," IEEE Access, vol. 7, pp. 105 948-105 961, 2019; B. Liu, M. Mohandes, H. Nuha, M. Deriche, and F. Fekri, "A distributed principal component analysis compression for smart seismic acquisition networks," IEEE Trans. Geosci. Remote Sens., vol. 56, no. 6, pp. 3020-3029 June 2018; A. Payani, F. Fekri, G. Alregib, M. Mohandes, and M. Deriche, "Compression of seismic signals via recurrent neural networks: Lossy and lossless algorithms," in SEG Tech. Progr. Expand. Abstr. 2019. Society of Exploration Geophysicists, August 2019, pp. 4082-4086; H. H. Nuha, A. Balghonaim, B. Liu, M. Mohandes, and F. Fekri, "Seismic data compression using deep neural network predictors," in SEG Tech. Progr. Expand. Abstr. 2019. Society of Exploration Geophysicists, August 2019, pp. 258-262. This is in contrast with the current seismic acquisition systems that presume passive seismic sensors. However, extra computing capability introduces a burden on battery-driven wireless geophones.

In order to achieve a high-resolution seismic image, a 32-bit scalar quantizer is often employed. Delta modulation (DM) is an alternative to the scalar quantizer. DM uses a simplistic analog-to-digital signal conversion technique. It is commonly used for coding and compression of correlated signals, including speech, audio, and image, and can be used for transmission of speech, audio, and image.

Accordingly, it is one object of the present disclosure to provide methods and systems for data compression that reduce the data traffic to the data center without putting an extra burden on a geophone. Minimal altered processing at geophone makes the method suitable for real-time quality checks without the need to process the data before a quick examination. In one aspect a corresponding CNN is trained offline on a synthetic data set permitting real-time implementation of the method and system.

SUMMARY

In an exemplary embodiment a seismic acquisition system, can include at least one seismic sensor having a 1-bit adaptive delta modulation (ADM) for converting analog seismic signals to a modulated signal and transmitting the modulated signal; and a data collection center, communicatively coupled to the least one seismic sensor, having processing circuitry and memory storing program instructions, which when executed by the processing circuitry perform a 1D convolutional neural network (CNN) for receiving and compressing the transmitted modulated signal.

In another exemplary embodiment, a method of in-field seismic data compression, can include converting, via a 1-bit adaptive delta modulation (ADM) in at least one seismic sensor, an analog seismic signal to a modulated signal and transmitting the modulated signal; and receiving and compressing, via processing circuitry configured with a 1D convolutional neural network (CNN) in a data collection center, the transmitted modulated signal.

In another exemplary embodiment, a non-transitory computer readable medium having instructions stored therein that, when executed by one or more processor, cause the one or more processors to perform a method of in-field seismic data compression, that can include converting, via a 1-bit adaptive delta modulation (ADM) in at least one seismic sensor, an analog seismic signal to a modulated signal and transmitting the modulated signal; and receiving and compressing, via a 1D convolutional neural network (CNN) in a data collection center, the transmitted modulated signal.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 4 1D CNN configuration with 3 convolutional layers and 1 fully connected layer according to certain embodiments.

FIG. 6A illustrates a f-x domain representation of noise in reconstructed traces before CNN, FIG. 6B illustrates f-x domain representation of noise in reconstructed traces after CNN, FIG. 6C illustrates average power spectrum of noise in reconstructed traces before and after CNN, FIG. 6D illustrates average power spectrum of original traces, according to certain embodiments.

FIG. 7A shows an original trace, FIG. 7B shows a reconstructed trace before CNN, FIG. 7C shows a reconstructed trace after CNN, according to certain embodiments.

DETAILED DESCRIPTION

Figure 1:
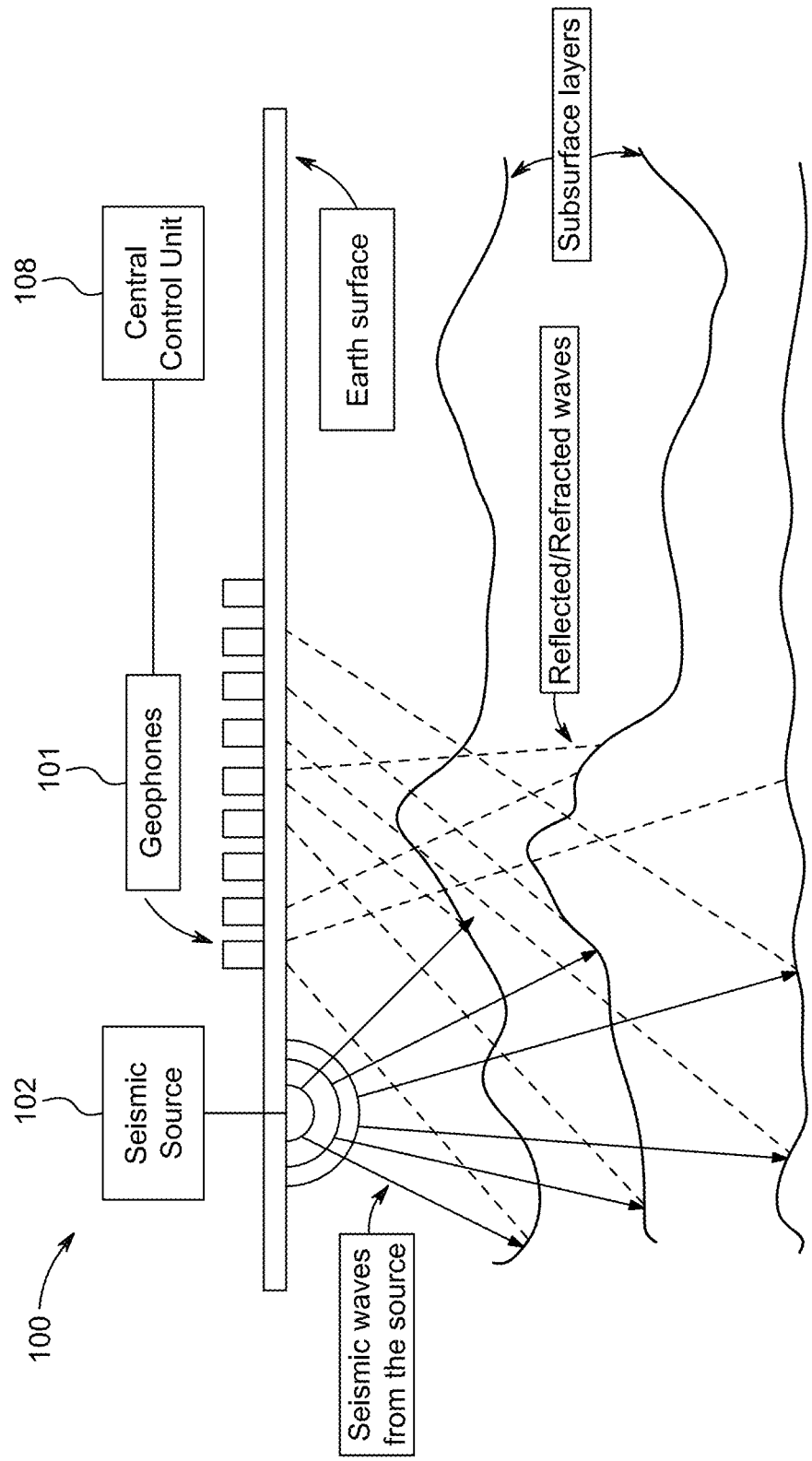
FIG. 1 depicts a geological environment 100 for seismic data detection, in accordance with an exemplary embodiment.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a system, device, and method for in-field seismic data compression using a 1D convolutional neural network (CNN) together with 1-bit adaptive delta modulation (ADM). At a geophone, 1-bit ADM is used to achieve compression. At the data center, after signal recovery, the CNN is used in order to enhance the signal-to-noise ratio (SNR). The CNN is trained offline on a synthetic data set, and hence, the CNN can be used for real-time implementation. Furthermore, no assumption on the underlying statistics of noise or the seismic signal is imposed and subsequently, the method is suitable for a wide range of seismic data. Furthermore, the method works in the time-domain, unlike existing transform-domain methods, making it suitable for quick diagnosis of bad traces at the data center.

The present disclosure emphasizes in-field compression of data at geophones such that processing power demand at the geophones is relaxed by eliminating complex algorithms and processes. The compression is achieved by using a fewer number of quantization bits at the geophone and then utilizing a 1D convolutional neural network (CNN) at the data center to recover a high-quality seismic signal. By this setup, the complex computations are done at the data center where power requirements are less important. This reduces the burden on a battery-driven wireless geophone while permitting continued transmission of the seismic data and, hence allows for more efficient data transfer using a limited resource wired or wireless channel.

FIG. 1 depicts a geological environment 100 for seismic data detection, in accordance with an exemplary embodiment. The geological environment 100 may include, but may not be limited to a seismic source 102, an array of geophones 101, and a central control unit 108. In one implementation, the seismic source 102 may be configured to transmit, in a controlled environment, seismoelectric waves towards the Earth's surface and subsurface layers. For example, the seismic source 102 might be dynamite or a seismic vibrator that creates a seismic wave that propagates into the subsurface. The seismic wave, in one example, may be an acoustic wave. The produced seismic wave propagates at the surface and subsurface layers of the Earth, and then, is partially reflected towards the surface by seismic reflectors. The seismic reflectors can be interfaces between subsurface strata characterized by different elastic properties. The reflected signals are then detected and recorded by seismic receivers located at or near the surface of the Earth. In one implementation, the array of the geophones 101 may be implemented on or near the surface to receive the reflected seismic waves. The array of geophones, thereby, may generate electric signals corresponding to the reflected seismic wave indicating the subsurface formation, positions, and activities. The electrical signal may be embedded with information regarding the subsurface and captured as a record of seismic data.

According to one embodiment, the array of geophones 101 may be implemented to create a dense field of sensors. In one example, the array of the geophone may be implemented as a vertical component of geophones 101. In another example, the array of the geophone may be implemented as horizontally aligned geophones 101. In a still further implementation the geophones are implemented as a cone such that the geophone at the apex of the cone is the deepest buried geophone which is surrounded by consecutively expanding circles of geophones with each successive geophone at a depth in the earth less than the depth of a predecessor circle until the last circle is on the surface of the Earth. In another implementation, the sensor devices may be hydrophones or accelerometers, or a combination thereof.

The data gathered by sensors and the array of geophones 101 may be collected by a central control unit 108. The central control unit 108 may be configured to perform analysis or other data processing required for wireless data transmission. The central control unit 108, in one implementation, may be controlled by a controller 206 (shown in FIG. 2). The controller 206 may include a set of executable commands, which upon execution, can control the operations of the central control unit 108. In one implementation, the data collected by the sensors and the array of geophones 101 may be used alone or in combination with other data. The data may be collected in one or more databases and/or transmitted to a data collection center (DCC) 214 (shown in FIG. 2). The data may be historical data, real-time data, or combinations thereof. The real-time data may be used in real-time, or stored for later use. The data may also be combined with historical data or other inputs for further analysis. The data may be stored in separate databases, or combined into a single database.

Figure 2:
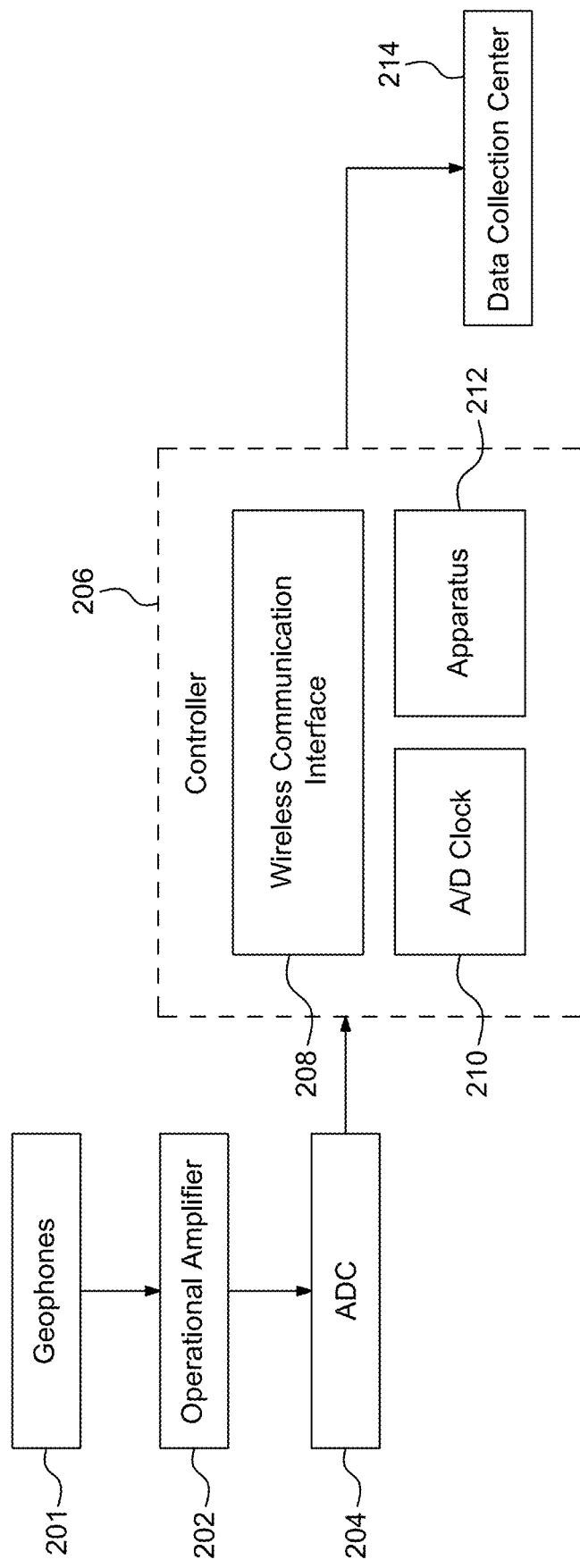
FIG. 2 depicts a general block diagram illustrating functional components of a seismic activity detection system, according to one embodiment.

FIG. 2 depicts a general block diagram illustrating functional components of a seismic activity detection system, according to one embodiment. The geophones 101 as sensor devices are described in reference to FIG. 1. The array of geophones 201, is an array of the sensor devices implemented to gather seismic data in a similar way as that of geophone 101. The geophone 201 can collect seismic waves, and convert the seismic waves into an electrical signal. The electrical signal may be converted into a digital signal. The seismic digital signal may be transmitted to a controller 206 for analysis and signal processing. The controller 206 may include an apparatus 212, configured for mitigating wireless data transmission impairments and enhancing the signal. The enhanced signal may be transmitted to a data collection center 214 through a wireless communication unit. Details of each functional component are described in subsequent paragraphs.

In one implementation, the array of the geophones 201 is configured to receive reflected/refracted seismic data in analog form. The amplitude of the analog signal, corresponding to the received seismic data, is amplified by an operational amplifier 202, in one implementation. The operational amplifier 202 is a well-known component in the art, therefore, a detailed description of the operational amplifier 202 is not provided in this disclosure for the sake of brevity. The amplified analog signal may be converted into a digital signal by an analog-to-digital converter (ADC) 204, in accordance with one implementation. The digital signal generated by the ADC 204 is a digital representation of the recorded analog seismic data.

In one implementation, the digital signal may be fed to the controller 206 for digital signal processing. The controller 206 may include, but may not be limited to a wireless communication interface 208 and an analog-to-digital clock 210.

The wireless communication interface 208 may be configured to perform at least one of receiving the first signal or transmitting a second signal to the wireless communication unit in an implementation. In one example, the wireless communication interface 208 is configured to receive the first signal, e.g., a digital signal corresponding to a seismic wave, from ADC 204. In another example, the wireless communication interface 208 is configured to transmit the second signal, e.g., digitally processed, to the data collection center 214. A wireless communication network, a wireless communication protocol, and/or parameters of wireless communication protocol may be selected in accordance with specific applications and requirements.

The wireless communication interface 208 may receive the first signal from the ADC 204 at the rate of the sampling frequency of the ADC 204. In one implementation, the A/D clock 210 may be configured to synchronize the digital signal reception in accordance with the sampling frequency of the ADC 204.

As mentioned above, DM uses a simplistic analog-to-digital signal conversion technique An alternative to the fixed step-size DM is an adaptive delta modulation (ADM) that offers reduced slope-overload noise and improved dynamic range. It is accomplished by introducing a predefined rule to vary the step size of the fundamental 1-bit quantizer in accordance with the input signal variations. Among the various ADM techniques proposed in the literature, the best-known ADM is 1-bit constant factor delta modulation. See Z. Peric, B. Denic, and V. Despotovic, "Novel two-bit adaptive delta modulation algorithms," Informatica, vol. 30, no. 1, pp. 117-134, January 2019; E. A. Prosalentis and G. S. Tombras, "A 2-bit adaptive delta modulation system with improved performance," EURASIP J. Adv. Signal Process., vol. 2007, no. 1, pp. 1-5, December 2006, each incorporated herein by reference in their entirety. In this scheme, a "memory" function is introduced to estimate step-size at each sampling instant.

Figure 3:
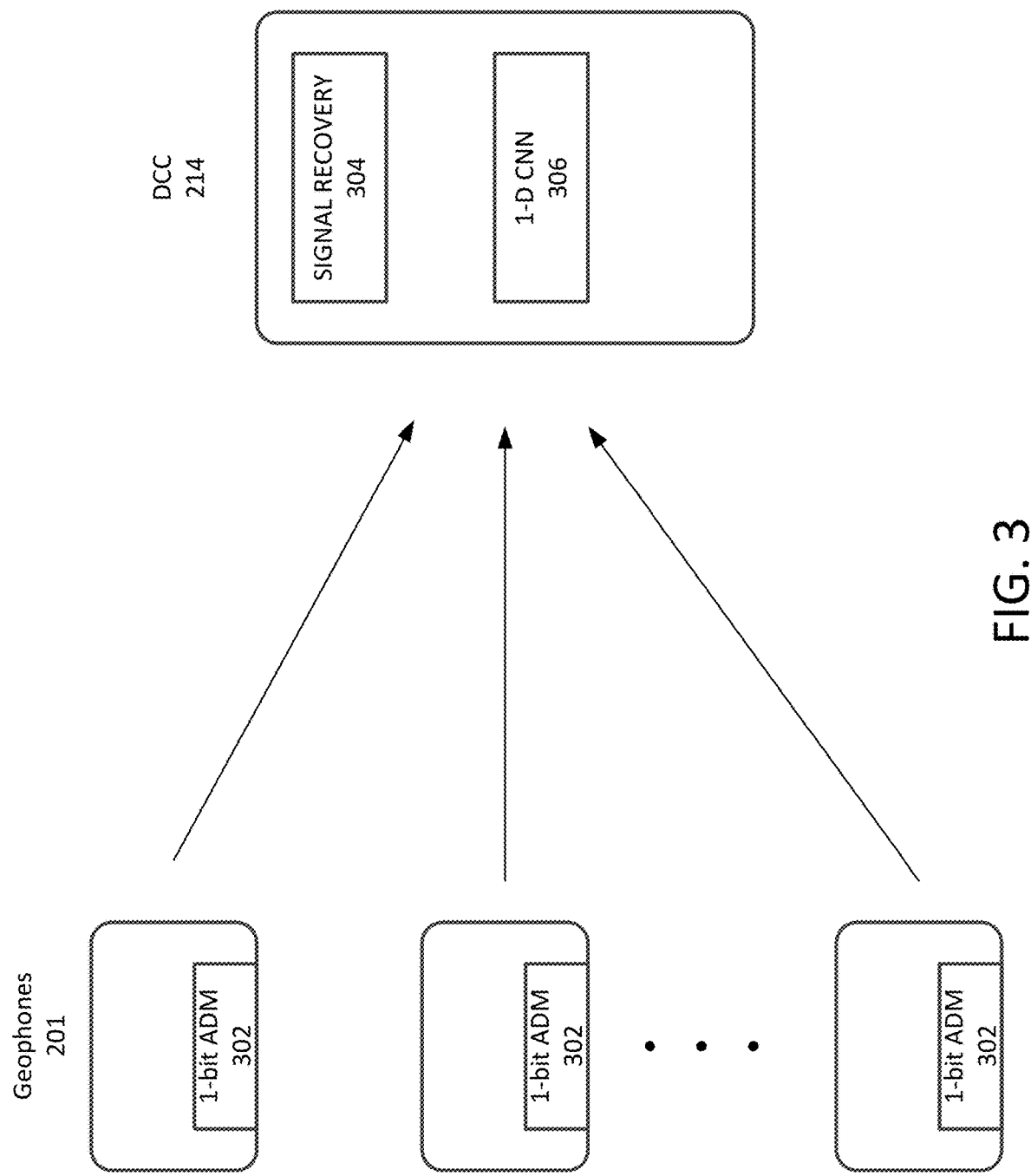
FIG. 3 depicts a seismic acquisition system, according to one embodiment.

FIG. 3 is a diagram of a seismic data system. At the geophone 201, 1-bit ADM 302 is used to achieve compression as part of analog-to-digital conversion 204. At the data center 214, a CNN 306 with 1D convolutional layers is used in order to enhance the SNR after signal recovery 304. Hence, the disclosed approach is named 1-ADM-CNN.

Moreover, compared with previously proposed methods for efficient seismic acquisition, there are five main benefits of the 1-ADM-CNN: first, it has a less computational cost; second, it can be widely applied to various types of seismic acquisition setups as there is no assumed underlying signal or noise model; third, it can be implemented in real-time thanks to offline training using synthetic data set; fourth, it is a standalone method and does not require cooperation among geophones, hence avoids extra processing burden and trace alignment; fifth, it is suitable for real-time quality check at the data center 214 as the received trace is in time-domain instead of transform-domain.

ADM-CNN

Operation of the 1-bit ADM is based on performing the quantization of the error signal instead of the original signal (trace) using 1-bit quantization at each instant (i.e., sampling time). The error signal e(k) is the result of input sample x(k) being subtracted from its predicted value y(k), i.e., e(k)=x(k)−y(k). The decision signal S(k) consists of binary pulses and takes the values +1 or −1. These values are fed into an integrator in the feedback loop. This results in a step-size $\delta(k)$ or $-\delta(k)$ change of its previous output value y(k−1). The steps for determining the error signal, decision signal, and the predicted value are as follows:

$$e(k) = x(k) - y(k), \quad (1)$$

$$S(k) = \text{sgn}[e(k)], \quad (2)$$

$$y(k) = y(k-1) + S(k)\delta(k). \quad (3)$$

In the ADM settings, the employed quantizer's step size is varied as per a predefined rule that depends on the input signal variations. Generally, the common instantaneous step-size adaptation techniques have the following form:

$$\delta(k) = R(k)\delta(k-1), \quad (4)$$

where $\delta(k)$ is the step-size at instant k with values within a region $[\delta_{min}, \delta_{max}]$ and R(k) is the respective step-size multiplier specified according to a particular rule. For instance, R(k) depends on the previous and present output binary decisions on error signal, i.e., S(k) and S(k−1), divulging a "memory" feature in the step-size computation at each sampling time, $R(k) = \alpha^{S(K-1)S(k)}$, where a $\alpha > 1$ (in this study $\alpha = 1.2$).

Initially, e(1)=0, S(1)=0, y(1)=0 and $\delta(1) = 2(2^8)$,
where $x_{max}$ and $x_{min}$ are maximum and minimum value of a trace x, respectively.

The samples S(k) with the initial value of the step-size $\delta(1)$ are transmitted by the wireless communication interface 208 to the data center 214. At the data center 214, the reverse procedure is performed to recover the analog seismic trace $\hat{x}$, i.e., $$\hat{x}(k) = \hat{x}(k-1) + S(k)\alpha^{S(k-1)S(k)}\delta(k-1). \quad (5)$$

Figure 4:
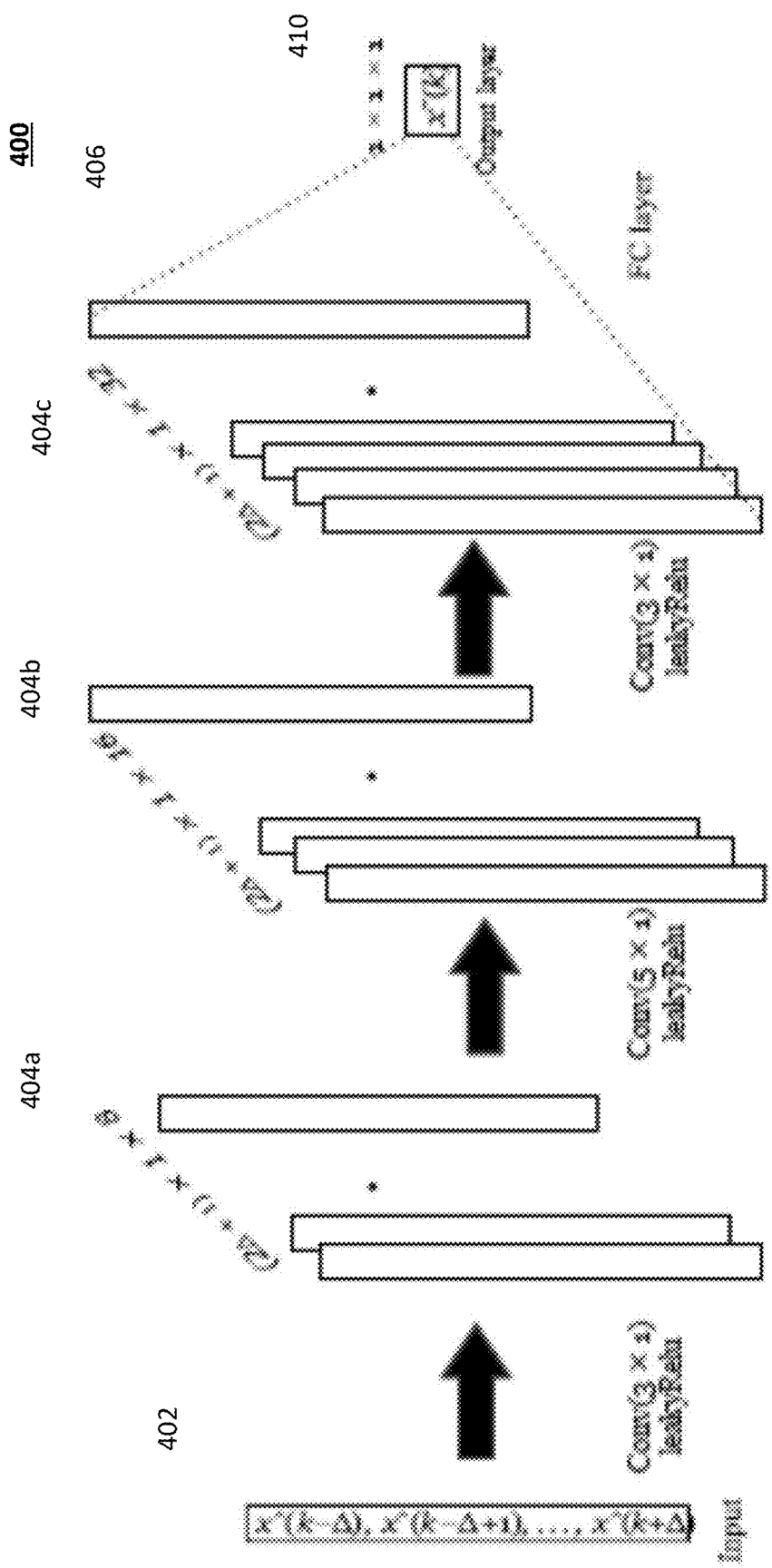

In conventional seismic signal recovery, a low-pass filter is used to remove quantization noise. However, in the present disclosure the recovered signal is modeled as follows:

$$\hat{x} = x + z, \quad (6)$$

where $\hat{x}$ is the trace after reconstruction back to the analog domain and z represents the quantization noise together with random noise. Recovering the signal in this way enables a neural network to remove this noise. FIG. 4 is a schematic for an architecture of the CNN. In this disclosure, a neural network 400 (FIG. 1) with three 1D convolutional (Conv) layers 404 and a fully connected (FC) layer 406 is used to suppress the quantization and random noise. The first 404a and last Conv 404c layers of the neural network have a filter size of 3×1, whereas the middle Conv layer 404b has a filter size of 5×1. The number of filters for the three Conv layers are 8, 16, and 32, respectively. The stride is set to 1 for all layers and after each Conv layer, a leaky rectified linear unit layer (leakyRelu) is added. The last layer of the network is an FC layer 306 with 1 neuron. Hence, the output $\tilde{x}$, which is a close approximation of x, can be obtained as $$\tilde{x}(k) = f\{\hat{x}(k-\Delta), \hat{x}(k-\Delta+1), \ldots, \hat{x}(k+\Delta)\}. \quad (7)$$

The target is to learn the mapping function f using CNN 400 as shown in FIG. 4. Following the model in (7) and FIG. 4, the sample value at instant k is estimated using $\Delta$ past and $\Delta$ future sample values. Since 1-bit ADM has a memory function, the introduction of memory in CNN 400 ensures the best possible reconstruction of the seismic signal. In experiments, the value of $\Delta$ is estimated empirically to be 7.

The parameters that need to be estimated in order to obtain a functional system are a set of weights and a bias. To obtain these parameters, the CNN 400 is trained using the stochastic optimization method, namely, adaptive moment estimation (ADAM). See D. P. Kingma and J. Ba, "Adam: A method for stochastic optimization," arXiv Prepr. arXiv1412.6980v9, December 2017, incorporated herein by reference in their entirety. The CNN 400 is trained with learning rate of 0.001, mini-batch size of 274, and gradient decay rate ($\beta_1$) D. P. Kingma et al. of 0.9. The weights are initialized with Glorot initializer (also known as Xavier initializer) and bias is set to zero initially. See X. Glorot and Y. Bengio, "Understanding the difficulty of training deep feedforward neural networks," in Thirteen. Int. Conf. Artif. Intell. Stat. PMLR, 2010, pp. 249-256, each incorporated herein by reference in its entirety. The loss function for the calculation of gradients is given as $E(k) = {}^1[x(k) - \tilde{x}(k)]^2$. To reduce the problem of overfitting, a regularization term is included with the loss function E(k) given as, $E_r(k) = E(k) + w^T w$, where w is the weight vector, incorporated herein by reference in its entirety. The regularization factor $\lambda$ in the above equation is set to 0.00005. See K. P. Murphy, Machine Learning: A Probabilistic Perspective. The MIT Press, Cambridge, Massachusetts, 2012, incorporated herein by reference in its entirety.

Training of CNN

To train the CNN 400, synthetic data is generated using Marmousi Model, which is commonly used as a standard case study in exploration seismology. See G. S. Martin, R. Wiley, and K. J. Marfurt, "Marmousi2: An elastic upgrade for marmousi," Lead. Edge, vol. 25, no. 2, pp. 156-166, February 2006, incorporated herein by reference in its entirety. The topology consists of 16 geophones with an inter-gap of 50 m in the horizontal axis, whereas shots are generated sequentially at the same location as every other geophone. The seismic data is generated using the various seismic source signatures, i.e., Ormsby wavelet with frequencies 0-5-45-50, 5-10-55-60, 0-5-45-70, 10-15, 65-70, 0-15-70-80, 0-5-55-60, 0-565-70, and 10-15-50-55 Hz. See "Ormsby wavelet." [Online]. Available: wiki.seg.org/wiki/Ormsby wavelet, incorporated herein by reference in its entirety. The use of different frequencies in the Ormsby wavelet ensures a well-trained CNN that can handle a wide range of data sets. The Ormsby wavelet has a trapezoidal frequency spectrum, which allows for more frequency domain flexibility as compared to the Ricker wavelet. This aids in the reconstruction of seismograms comparable to real seismic data. The sampling frequency is set to 4 kHz and the Matlab package is used for the generation of synthetic data. See G. F. Margrave and M. P. Lamoureux, Numerical Methods of Exploration Seismology. Cambridge University Press, December 2018, incorporated herein by reference in its entirety.

Considering the above-mentioned setup, a total of 2048 traces are generated. Since each trace has 9880 samples and the CNN model 400 works on sample-by-sample basis, there are 9880×2048≈20 million training data points. However, randomly selected 66 traces are only used to reduce the time without losing accuracy. This is the added advantage of the proposed setup, i.e., fewer traces are used to generate more training data points by operating in sample-by-sample manner. In short, the output 410 of CNN is the generated synthetic data samples, whereas, the input 402 is the recovered synthetic samples data using (5).

Before feeding the training data to the CNN 400, it is randomized and then shuffled after each epoch. The input training data, i.e., predictors P and output training data, i.e., targets T are z-normalized as follows:

$$P = \frac{P - \mu_P}{\sigma_P}, T = \frac{T - \mu_t}{\sigma_t}$$

where [$\mu_p$, $\sigma_p$] and [$\mu_t$, $\sigma_t$] are the [mean, variance] of P and T respectively. Furthermore, 10% of the data is used for validation. Training is automatically stopped when deterioration in the validation loss (sum of half mean squared errors for validation set) is observed, i.e., the validation loss becomes larger than or equal to the previously smallest loss for 5 epochs.

Figures 5A, 5B:
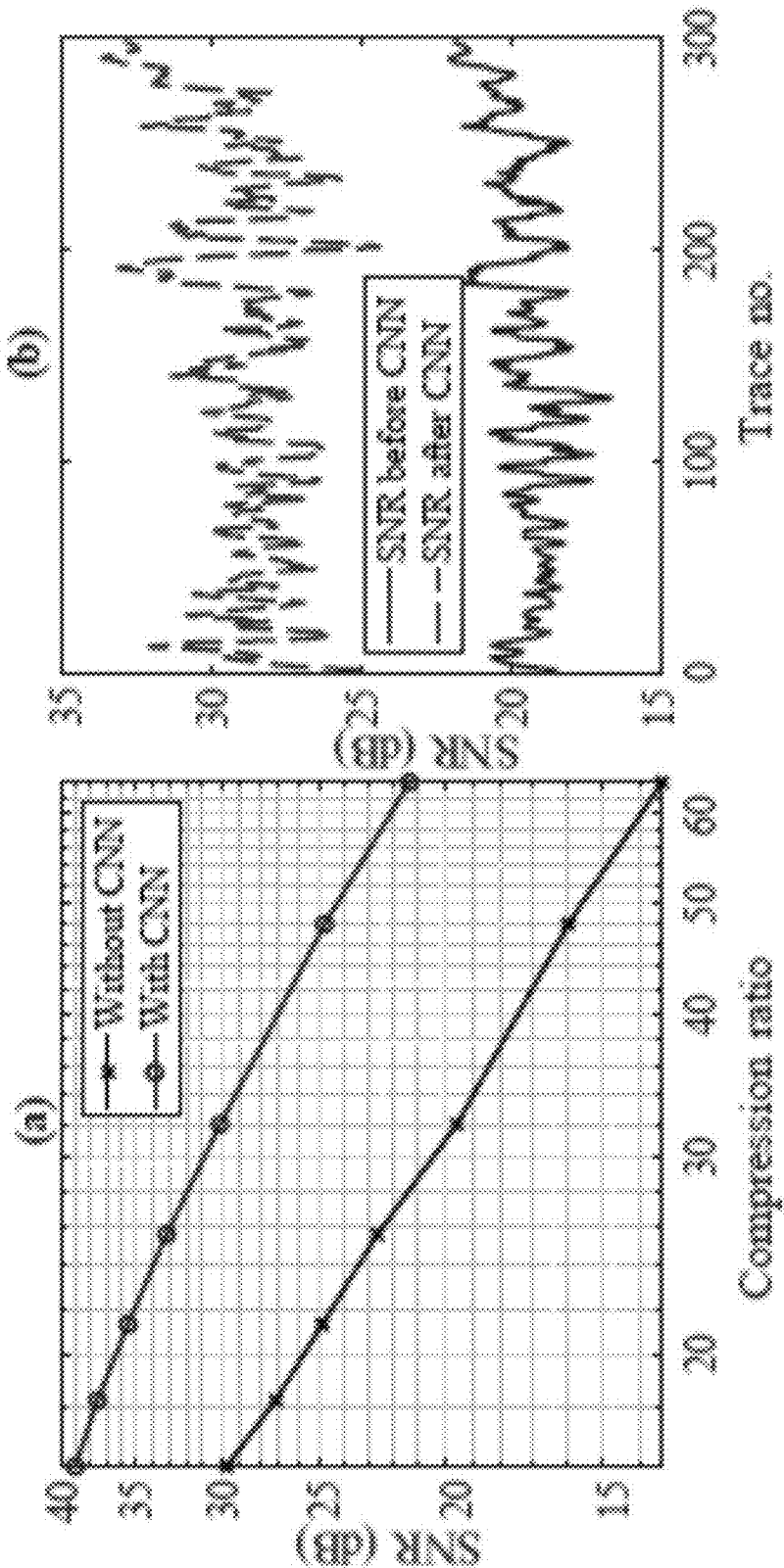
FIG. 5A is a graph of a comparison of the SNR of reconstructed traces before and after CNN for various values of compression ratio.
FIG. 5B is a graph of trace-by-trace comparison for compression ratio of 32, according to certain embodiments.

The CNN 400 is trained on the synthetic data which is generated using the Marmousi model, as previously explained. It is tested on data from the Utah Tomography and Modeling/Mitigation Consortium (UTAM) to verify its performance. See "UTAM seismic data library." [Online]. Available: utam.gg.utah. edu/SeismicData/SeismicData.html, incorporated herein by reference in its entirety. Each trace in this dataset has 4000 samples with fs=4 kHz sampling frequency. It is important to have the same sampling frequency of the data to be denoised and the training data set to get high accuracy. The data is cleaned in the pre-processing stage by removing bad traces caused by malfunctioning geophones. The 1-bit ADM performance is evaluated $^P$ with and without the CNN and the results are shown in FIGS. 5A and 5B. For FIG. 5A the compression gains and the SNR are calculated by averaging the values across all traces. Here, the sampling frequency is increased (p>q) or decreased (q>p) using a factor of p/q in order to achieve a gain in SNR or in compression, respectively. Compression ratio (CR) is calculated with respect to the 32-bit quantized signal as CR=32×$\frac{q}{p}$, where p and q are non-zero positive integer numbers. Note here that, for a specific CR, the CNN 300 is trained with the same CR on the synthetic data. It is depicted in FIG. 5A that significant performance enhancement is achieved by using the pre-trained CNN, especially with high compression gains. For instance, nearly 10 dB increase in SNR is achieved at a compression gain of 32. Since average SNR does not always give a clear picture, trace-by-trace comparison is also shown (FIG. 5B) to justify the performance of the 1-ADM-CNN. The figure confirms the performance consistency and SNR improvement observed over all the traces.

Figure 6A:
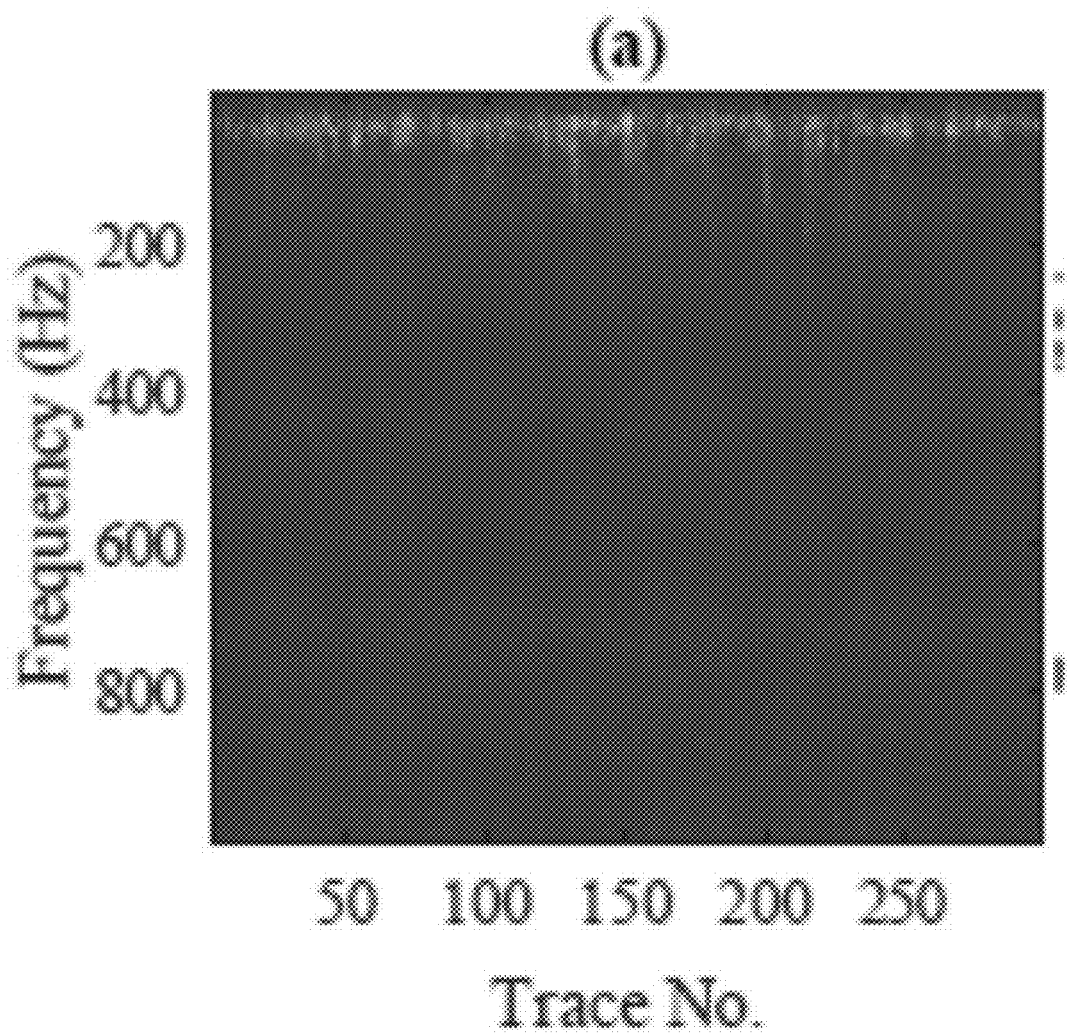
FIGS. 6A, 6B, 6C, 6D illustrate frequency spectrum at a compression ratio of 32.
Figure 6B:
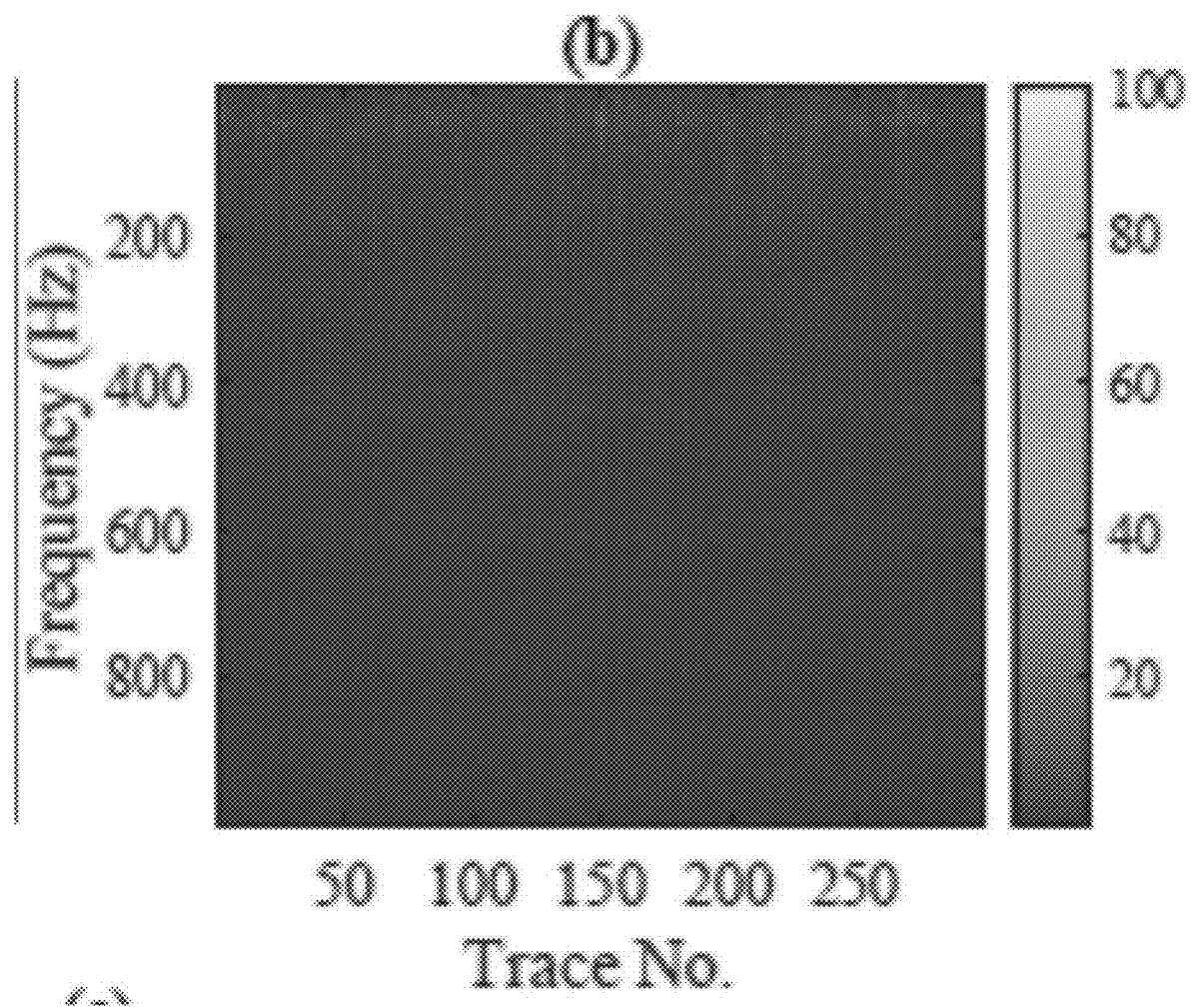
Figure 6C:
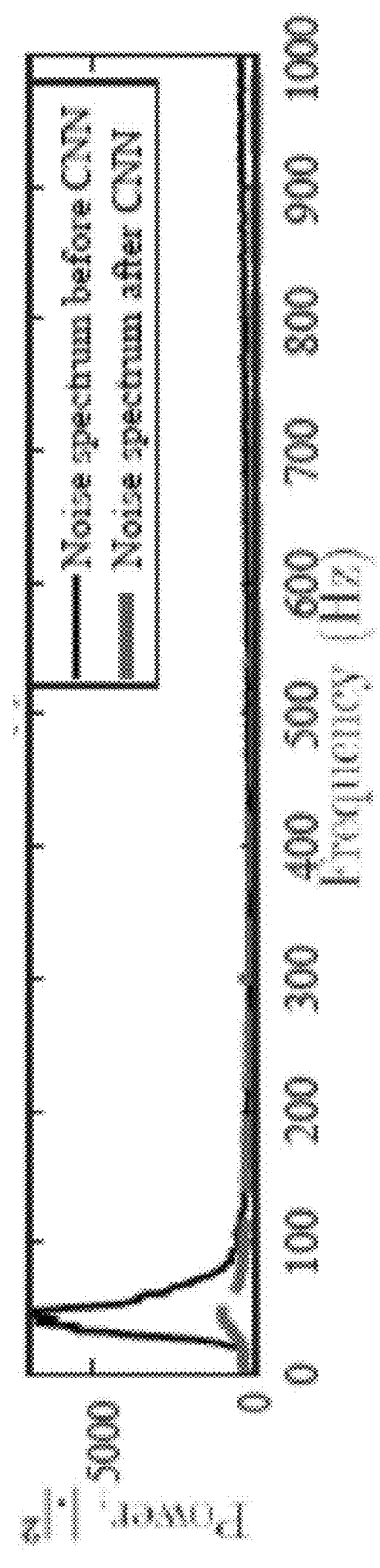
Figure 6D:
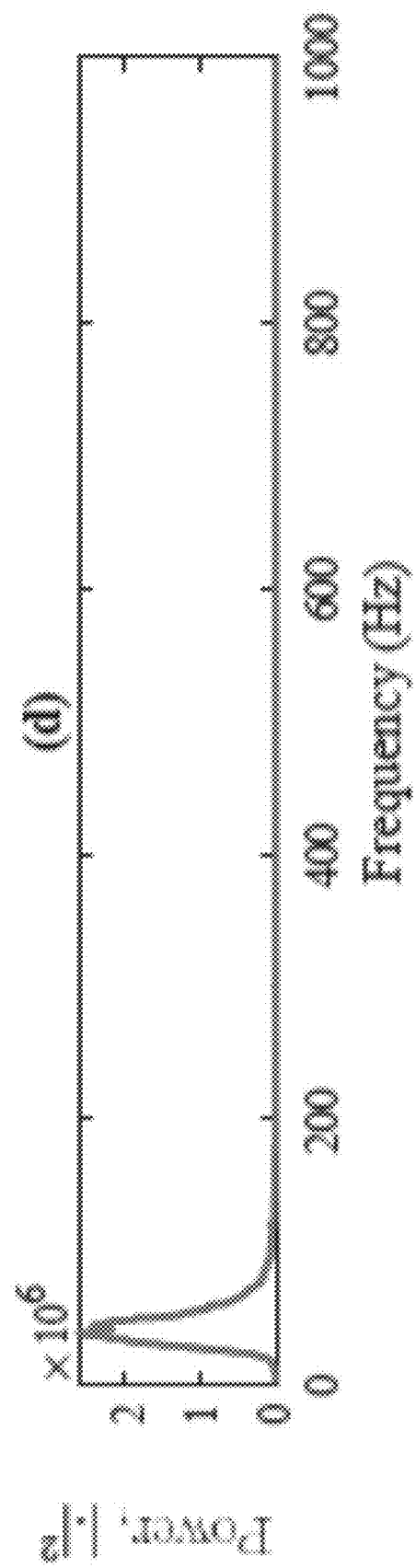

FIGS. 6A and 6B depict residual noise before and after the CNN in the frequency-space (f-x) domain, respectively. The noise attenuation is obvious in this figure. Furthermore, the method not only successfully removes the high-frequency noise but also low-frequency noise. It can be seen from FIGS. 6C and 6D that there is in-band noise which is suppressed by using the CNN 400. As such, widely known denoising methods, like bandpass filter, wavelet decomposition, weighted average, and wiener filters, are not suitable to remove in-band quantization noise. See N. Iqbal, A. Zerguine, S. Kaka, and A. Al-Shuhail, "Observation-driven method based on iir wiener filter for microseismic data denoising," Pure Appl. Geophys., vol. 175, no. 6, pp. 2057-2075 June 2018, incorporated herein by reference in its entirety. Furthermore, it is not required to define frequency band in case of the bandpass filter, threshold/mother wavelet in case of wavelet decomposition, weights in case of weighted averaged filtering and noise/signal statistics in case of wiener filter.

Figure 7A:
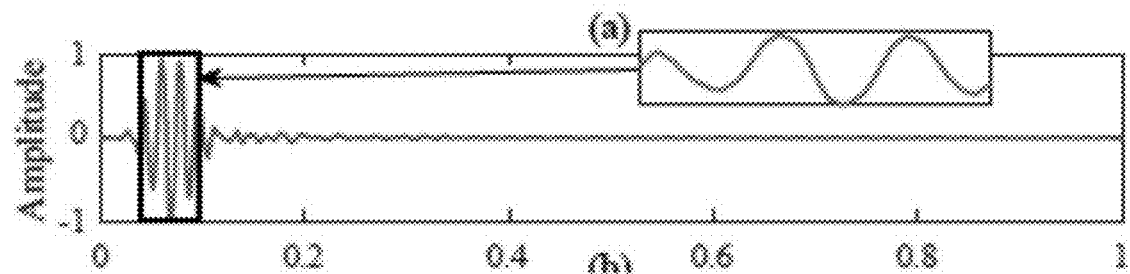
FIGS. 7A, 7B, 7C illustrate a single trace comparison at compression ratio of 64.
Figure 7B:
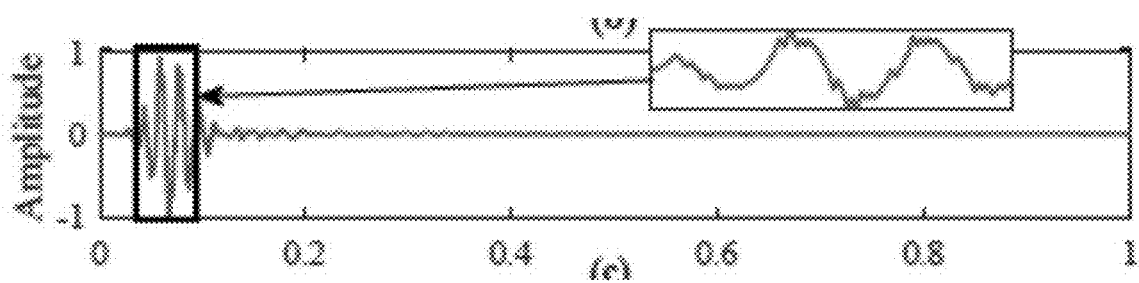
Figure 7C:
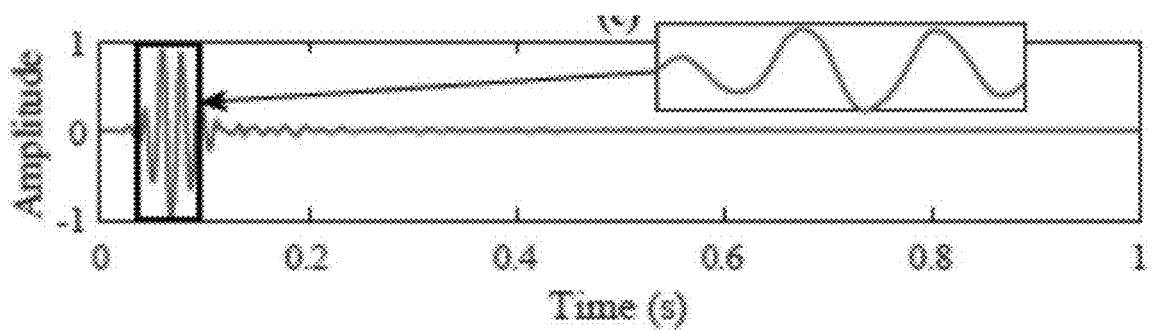

FIGS. 7A to 7C show a comparison of a reconstructed trace with the original trace at compression ratio of 64. The improvement is visible before and after using CNN 400.

Next, five state-of-the-art compression methods for seismic data are used as benchmark schemes to assess the data recovering performance of the proposed compression method. One of the methods is CSA-GAN, which is a combination of compressive sensing architecture (CSA) and generative adversarial networks (GAN); another seismic data compression method is distributed principal component analysis (DPCA); two other recently proposed methods are recurrent neural network (RNN) (this method also utilizes entropy encoder) and rate optimized dictionary learning (RODL); and the last baseline technique is JPEG2000, which has proven its efficiency for daily-life images relying on the irreversible Cohen-Daubechies-Feauveau (CDF) 9/7 wavelet transform. For comparison, the compression gain is set 16 for all methods. This is to ensure the best performance from each method. Table I, shows the SNR comparison of the aforementioned methods together with computational complexity. The comparison reveals that the proposed compression method has a significantly better performance in terms of SNR and computational complexity than the benchmark methods (which use an N-bit quantizer and other complex methods for compression). From the perspective of the bandwidth requirement, energy consumption, and transmission time, the approaches given in, and, respectively, can be used to further validate the superiority of the proposed method. Another method is not used for comparison because of strict dependency on the efficient trace alignment. See H. H. Nuha, A. Balghonaim, B. Liu, M. Mohandes, and F. Fekri, "Seismic data compression using deep neural network predictors," in *SEG Tech. Progr. Expand. Abstr.* 2019. Society of Exploration Geophysicists, August 2019, pp. 258-262, incorporated herein by reference in its entirety. Hence the exact compression and recovery performance are not achieved.

TABLE 1

Comparison of averaged SNR obtained using various methods for compression ratio of 16 (N > 1).

| Method | SNR(dB) | Computational Complexity at geophone |
|---|---|---|
| JEPG2000 | 15.20 | N -bit quantization + wavelet transform |
| CSA-GAN | 19.83 | N -bit quantization + compressive sensing + GAN |
| DPCA | 16.37 | N -bit quantization + DPCA |
| RNN | 20.39 | N -bit quantization + RNN + entropy encoder |
| RODL | 24.64 | N -bit quantization + dictionary formation + distribution estimation encoder |
| 1-ADM-CNN | 39.10 | 1-bit quantization |

One of the important tasks during the seismic data acquisition is a quick quality check (QQC), which is performed after every shot to ensure the correct reception of data from all the geophones. From FIG. 7B, it can be seen that the data before CNN matches closely with the original data and can be used for QQC. Methods that work by transforming the data to other domains might need to perform the reverse operation in order to get time-domain traces before doing QQC. Hence, this added advantage of the proposed method reduces the time during acquisition. In short, the 1-ADM-CNN performs the compression while staying in the time-domain, and hence, other acquisition operations are performed seamlessly. Finally, the aforementioned methods rely on the cooperation among the geophones to achieve desired compression ratios. This puts an extra processing burden on the battery-driven geophones. The disclosed method works in a standalone manner, hence easing the processing load at a geophone.

Figure 8:
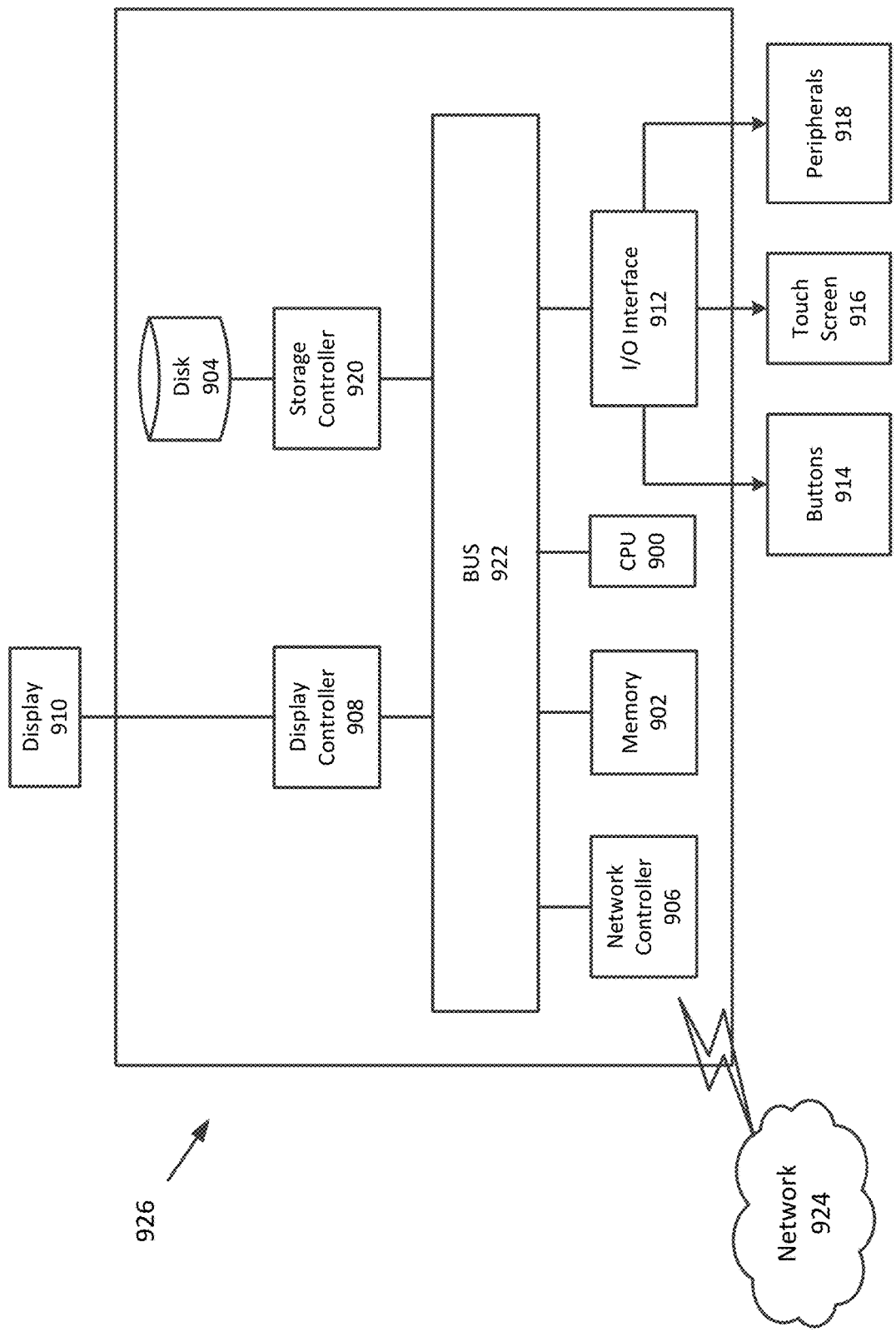
FIG. 8 is an exemplary schematic diagram of a data processing system used within the computing system, according to certain embodiments.

Next, further details of the hardware description of the computing environment according to exemplary embodiments is described with reference to FIG. 8. In FIG. 8, a controller 900 is described is representative of the system 1000 of FIG. 9 in which the controller is a computing device which includes a CPU 901 which performs the processes described above/below. The process data and instructions may be stored in memory 902. These processes and instructions may also be stored on a storage medium disk 904 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 901, 903 and an operating system such as Microsoft Windows 7, Microsoft Windows, UNIX, Solaris, LINUX, Apple MAC-OS and other systems known to those skilled in the art.

The hardware elements in order to achieve the computing device may be realized by various circuitry elements, known to those skilled in the art. For example, CPU 901 or CPU 903 may be a Xenon or Core processor from Intel of America or an Opteron processor from AMD of America, or may be other processor types that would be recognized by one of ordinary skill in the art. Alternatively, the CPU 901, 903 may be implemented on an FPGA, ASIC, PLD or using discrete logic circuits, as one of ordinary skill in the art would recognize. Further, CPU 901, 903 may be implemented as multiple processors cooperatively working in parallel to perform the instructions of the inventive processes described above.

The computing device in FIG. 8 also includes a network controller 906, such as an Intel Ethernet PRO network interface card from Intel Corporation of America, for interfacing with network 960. As can be appreciated, the network 960 can be a public network, such as the Internet, or a private network such as an LAN or WAN network, or any combination thereof and can also include PSTN or ISDN subnetworks. The network 760 can also be wired, such as an Ethernet network, or can be wireless such as a cellular network including EDGE, 3G, 4G, 5G wireless cellular systems. The wireless network can also be WiFi, Bluetooth, or any other wireless form of communication that is known.

The computing device further includes a display controller 908, such as a NVIDIA GeForce GTX or Quadro graphics adaptor from NVIDIA Corporation of America for interfacing with display 910, such as a Hewlett Packard HPL2445w LCD monitor. A general purpose I/O interface 912 interfaces with a keyboard and/or mouse 914 as well as a touch screen panel 916 on or separate from display 910. General purpose I/O interface also connects to a variety of peripherals 918 including printers and scanners, such as an OfficeJet or DeskJet from Hewlett Packard.

A sound controller 920 is also provided in the computing device such as Sound Blaster X-Fi Titanium from Creative, to interface with speakers/microphone 922 thereby providing sounds and/or music.

The general purpose storage controller 924 connects the storage medium disk 904 with communication bus 926, which may be an ISA, EISA, VESA, PCI, or similar, for interconnecting all of the components of the computing device. A description of the general features and functionality of the display 910, keyboard and/or mouse 914, as well as the display controller 908, storage controller 924, network controller 906, sound controller 920, and general purpose I/O interface 912 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 9.

Figure 9:
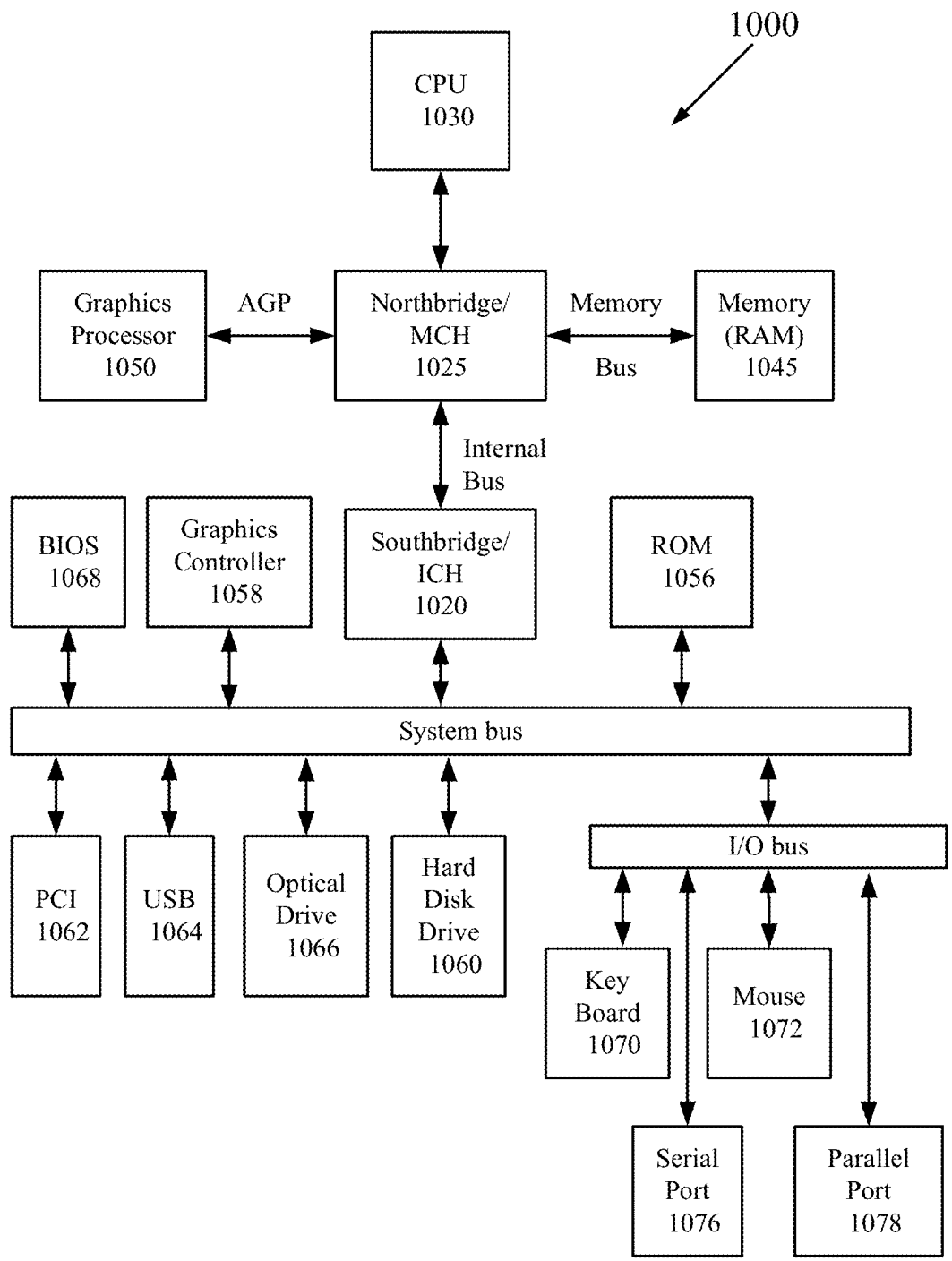
FIG. 9 is an exemplary schematic diagram of a processor used with the computing system, according to certain embodiments.

FIG. 9 shows a schematic diagram of a data processing system, according to certain embodiments, for performing the functions of the exemplary embodiments. The data processing system is an example of a computer in which code or instructions implementing the processes of the illustrative embodiments may be located.

In FIG. 9, data processing system 1000 employs a hub architecture including a north bridge and memory controller hub (NB/MCH) 1025 and a south bridge and input/output (I/O) controller hub (SB/ICH) 1020. The central processing unit (CPU) 1030 is connected to NB/MCH 1025. The NB/MCH 1025 also connects to the memory 845 via a memory bus, and connects to the graphics processor 1050 via an accelerated graphics port (AGP). The NB/MCH 1025 also connects to the SB/ICH 1020 via an internal bus (e.g., a unified media interface or a direct media interface). The CPU Processing unit 1030 may contain one or more processors and even may be implemented using one or more heterogeneous processor systems.

Figure 10:
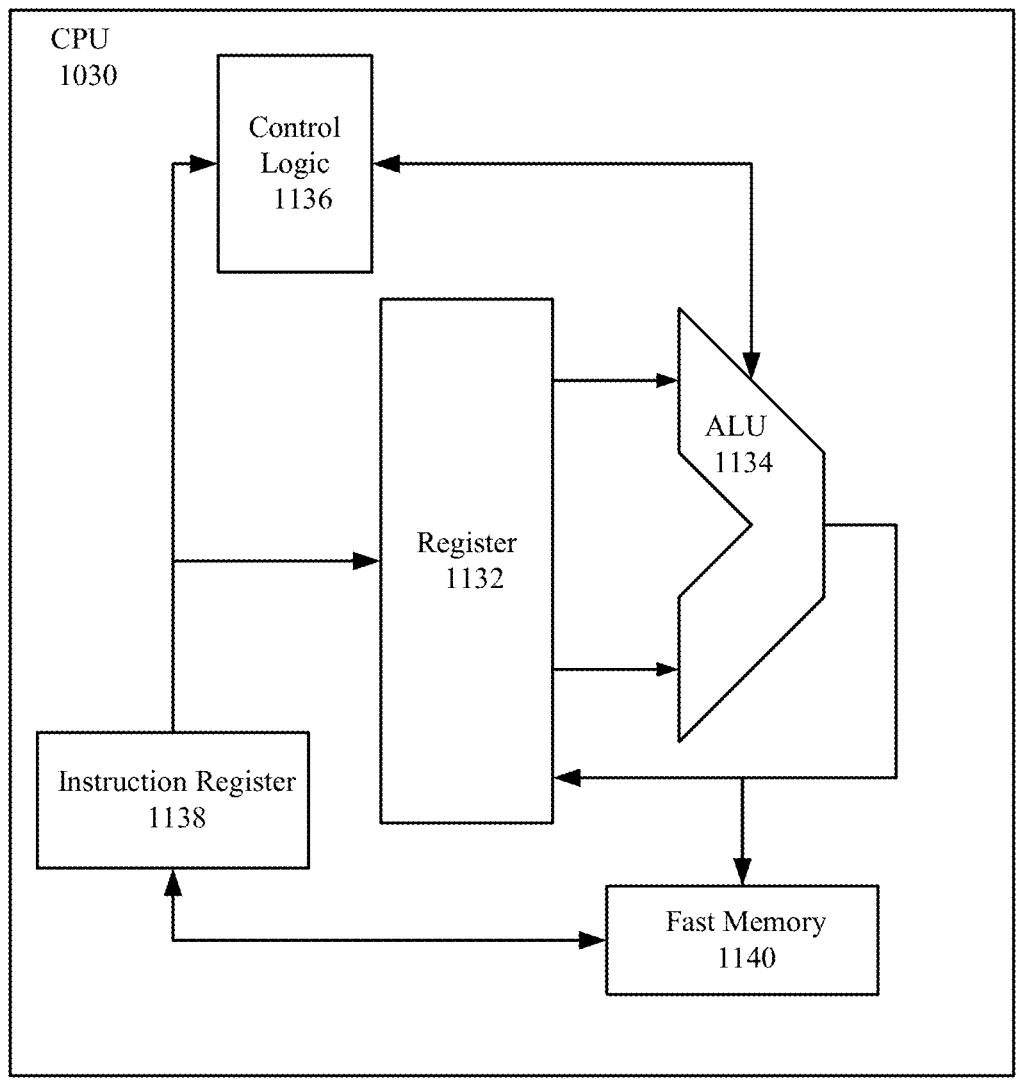
FIG. 10 is an illustration of a non-limiting example of distributed components which may share processing with the controller, according to certain embodiments.

For example, FIG. 10 shows one implementation of CPU 1030. In one implementation, the instruction register 1138 retrieves instructions from the fast memory 1140. At least part of these instructions are fetched from the instruction register 1138 by the control logic 1136 and interpreted according to the instruction set architecture of the CPU 1030. Part of the instructions can also be directed to the register 1132. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1134 that loads values from the register 1132 and performs logical and mathematical operations on the loaded values according to the instructions. The results from these operations can be feedback into the register and/or stored in the fast memory 1140. According to certain implementations, the instruction set architecture of the CPU 1030 can use a reduced instruction set architecture, a complex instruction set architecture, a vector processor architecture, a very large instruction word architecture. Furthermore, the CPU 1030 can be based on the Von Neuman model or the Harvard model. The CPU 1030 can be a digital signal processor, an FPGA, an ASIC, a PLA, a PLD, or a CPLD. Further, the CPU 1030 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 9, the data processing system 1000 can include that the SB/ICH 1020 is coupled through a system bus to an I/O Bus, a read only memory (ROM) 1056, universal serial bus (USB) port 1064, a flash binary input/output system (BIOS) 1068, and a graphics controller 1058. PCI/PCIe devices can also be coupled to SB/ICH 1088 through a PCI bus 1062.

The PCI devices may include, for example, Ethernet adapters, add-in cards, and PC cards for notebook computers. The Hard disk drive 1060 and CD-ROM 1066 can use, for example, an integrated drive electronics (IDE) or serial advanced technology attachment (SATA) interface. In one implementation the I/O bus can include a super I/O (SIO) device.

Further, the hard disk drive (HDD) 1060 and optical drive 866 can also be coupled to the SB/ICH 1020 through a system bus. In one implementation, a keyboard 1070, a mouse 1072, a parallel port 1078, and a serial port 1076 can be connected to the system bus through the I/O bus. Other peripherals and devices that can be connected to the SB/ICH 1020 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein may also be executed by various distributed components of a system. For example, one or more processors may execute these system functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A seismic acquisition system, comprising:
   at least one seismic sensor having a 1-bit adaptive delta modulation (ADM) for converting analog seismic signals to a modulated signal and transmitting the modulated signal; and
   a data collection center, communicatively coupled to the least one seismic sensor, having processing circuitry and memory storing program instructions, which when executed by the processing circuitry perform a 1D convolutional neural network (CNN) for receiving and recovering the transmitted modulated signal,
   wherein the 1D CNN is trained to suppress quantization and random noise in the modulated signal.

2. The system of claim 1, wherein the 1D CNN is a neural network with three 1D convolutional layers and a fully connected layer.

3. The system of claim 1, wherein the processing circuitry is configured to train the 1D CNN offline using a stochastic optimization algorithm.

4. The system of claim 3, wherein the stochastic optimization algorithm is an adaptive moment estimation (ADAM).

5. The system of claim 1, wherein the 1-bit ADM is configured to
   perform quantization of an error signal using 1-bit quantization at each sampling time,
   generate a decision signal based on the quantized error signal, and
   feed the decision signal into an integrator in a feedback loop to obtain a predicated value,
   wherein the error signal is a difference between an input sample at a sampling time and the predicted value.

6. The system of claim 5, wherein a quantizer step of the 1-bit quantization is based on the input sample.

7. The system of claim 1, wherein the processing circuitry is further configured to learn a mapping function using the 1D CNN to reconstruct the analog seismic signals from the transmitted modulated signal.

8. A method of in-field seismic data compression, comprising:

converting, via a 1-bit adaptive delta modulation (ADM) in at least one seismic sensor, an analog seismic signal to a modulated signal and transmitting the modulated signal; and receiving and recovering, via processing circuitry configured with a 1D convolutional neural network (CNN) in a data collection center, the transmitted modulated signal, wherein the 1D CNN is trained to suppress quantization and random noise in the modulated signal.

9. The method of claim 8, wherein the 1D CNN is a neural network with three 1D convolutional layers and a fully connected layer.

10. The method of claim 8, further comprising:

training, via the processing circuitry, the 1D CNN offline using a stochastic optimization algorithm.

11. The method of claim 10, wherein the stochastic optimization algorithm is an adaptive moment estimation (ADAM).

12. The method of claim 8, wherein the converting comprises:

quantizing an error signal using 1-bit quantization at each sampling time;

generate a decision signal based on the quantized error signal; and feeding the decision signal into an integrator in a feedback loop to obtain a predicated value, wherein the error signal is a difference between an input sample at a sampling time and the predicted value.

13. The method of claim 12, wherein a quantizer step of the 1-bit quantization is based on the input sample.

14. The method of claim 8, wherein the recovering comprises:

learning a mapping function using the 1D CNN to reconstruct the analog seismic signals from the transmitted modulated signal.

15. A non-transitory computer readable medium having instructions stored therein that, when executed by one or more processors, cause the one or more processors to perform a method of in-field seismic data compression, comprising:

converting, via a 1-bit adaptive delta modulation (ADM) in at least one seismic sensor, an analog seismic signal to a modulated signal and transmitting the modulated signal; and receiving and recovering, via a 1D convolutional neural network (CNN) in a data collection center, the transmitted modulated signal, wherein the 1D CNN is trained to suppress quantization and random noise in the modulated signal.

16. The non-transitory computer readable medium of claim 15, wherein the 1D CNN is a neural network with three 1D convolutional layers and a fully connected layer.

17. The non-transitory computer readable medium of claim 15, wherein the method further comprises:

training the 1D CNN offline using a stochastic optimization algorithm.

18. The non-transitory computer readable medium of claim 17, wherein the stochastic optimization algorithm is an adaptive moment estimation (ADAM).

19. The non-transitory computer readable medium of claim 15, wherein the converting comprises:

quantizing an error signal using 1-bit quantization at each sampling time;

generate a decision signal based on the quantized error signal; and feeding the decision signal into an integrator in a feedback loop to obtain a predicated value, wherein the error signal is a difference between an input sample at a sampling time and the predicted value.

20. The non-transitory computer readable medium of claim 19, wherein a quantizer step of the 1-bit quantization is based on the input sample.

* * * * *